United States Patent [19]

Herron et al.

[11] Patent Number: 5,139,975
[45] Date of Patent: Aug. 18, 1992

[54] SINTERING ARRANGEMENT FOR ENHANCING REMOVAL OF CARBON FROM CERAMIC SUBSTRATE LAMINATES

[75] Inventors: Lester W. Herron; Sarah H. Knickerbocker; Ananda H. Kumar, all of Hopewell Junction; Govindarajan Natarajan, Fishkill; Srinivasa S. N. Reddy, LaGrangeville, all of N.Y.

[73] Assignee: International Business Machines Corporation, Armonk, N.Y.

[21] Appl. No.: 757,782

[22] Filed: Sep. 11, 1991

Related U.S. Application Data

[62] Division of Ser. No. 523,949, May 16, 1990, Pat. No. 5,053,361, which is a division of Ser. No. 220,192, Jul. 18, 1988, Pat. No. 4,971,738.

[51] Int. Cl.$^5$ ............................................. C03L 10/12
[52] U.S. Cl. .......................................... 501/7; 501/9; 428/137; 428/901
[58] Field of Search ............... 428/137, 209, 426, 432, 428/433, 901; 156/89; 501/7, 9

[56] References Cited

U.S. PATENT DOCUMENTS

| | | | |
|---|---|---|---|
| 4,714,570 | 12/1987 | Nakatani et al. | 252/518 |
| 5,004,640 | 4/1991 | Nakatani et al. | 428/195 |
| 5,021,296 | 6/1991 | Suzuki et al. | 428/409 |

*Primary Examiner*—Mark L. Bell
*Assistant Examiner*—Alan Wright
*Attorney, Agent, or Firm*—Ira David Blecker

[57] ABSTRACT

There is disclosed a sintering arrangement for enhancing the removal of carbon from multilayer ceramic substrate laminate during the sintering thereof. A multilayer ceramic substrate laminate having metallic lines and vias is provided with a reducible metal oxide in close proximity to the substrate laminate. The multilayer ceramic substrate laminate contains a polymeric binder which upon heating depolymerizes into carbon. The substrate laminate is sintered in an atmosphere which is reducing with respect to the reducible metal oxide and which is oxidizing with respect to the carbon.

15 Claims, 3 Drawing Sheets

SINTERING ARRANGEMENT FOR ENHANCING REMOVAL OF CARBON FROM CERAMIC SUBSTRATE LAMINATES

This is a division of application Ser. No. 07/523,949, filed May 16, 1990, now U.S. Pat. No. 5,053,361, which is a division of application Ser. No. 07/220,192 filed Jul. 18, 1988, now U.S. Pat. No. 4,971,738.

BACKGROUND OF THE INVENTION

The present invention relates to the removal of organic binders from ceramic substrate laminates. More specifically, the present invention teaches a method and sintering arrangement for achieving superior binder removal while sintering a ceramic body in an oxygen-containing environment without oxidizing any associated metallurgy.

In the field of microelectronics, ceramics serve as superior insulators and carriers for metallurgy. The ceramics can be sintered to a dense state wherein they exhibit strength as well as favorable dielectric properties Ceramics may be pre-fired and subsequently metallized, as is done commonly for simple chip carriers; however, in packages for use in high performance computers, greater circuit densities are desirable. Greater circuit density may be realized in a multilayer body wherein unfired ceramics are cast into sheets, patterned and metallized and subsequently aligned and stacked. The stack is then laminated and fired to form a fully sintered body.

The firing of stacked and metallized ceramics involves careful selection of materials and processing conditions. The firing temperatures and environment must be compatible with the metallurgy associated with the ceramic. Furthermore, the binders and plasticizers which are added to the ceramic slurry must be removed prior to the densification of the ceramic particles. Typically, the binders and plasticizers are chosen so that they depolymerize into volatile hydrocarbons and carbonaceous residues upon heating to a particular temperature. If the carbonaceous residue (hereinafter referred to simply as carbon) is not fully removed, the ceramic obtained will be porous, weak and of inferior insulating characteristics.

The time-temperature-ambient regimen used in substrate laminate sintering is generally called the firing cycle. Various firing cycles have been proposed wherein oxygen in the form of steam is provided to the substrate laminate in carefully controlled amounts in order to facilitate the removal of the carbon. The steam reacts with the carbon to form carbon dioxide and hydrogen As taught in Herron et al. U.S. Pat. No. 4,234,367, the partial pressure of oxygen in the ambient is controlled by introducing controlled amounts of free hydrogen with the steam, thereby recapturing any free oxygen to prohibit it from reacting with the associated metallurgy Herron et al. further illustrate a system wherein the associated metallurgy is copper and the ceramic is a glass ceramic. To allow any amount of the copper to be oxidized gives rise to expansion problems whereby the copper oxide formed would expand in the internal layers and place tremendous stresses on the ceramic.

Kamehara et al. U.S. Pat. No. 4,504,339 also teaches a system for firing a ceramic and metal stack in an oxygen-containing ambient. Kamehara et al. similarly claims control of the partial pressure of the oxygen at low pre-densification temperatures to prohibit oxidation of the conductors.

Herron et al. U.S. Pat. No. 4,627,160 have proposed adding a catalyst to the slurry of ceramic particles, binder and solvent as an aid in promoting the effective removal of the carbonaceous materials. Proposed for use as catalysts are copper and copper oxides. As a practical matter, the maximum amount of catalyst is limited to about 0.15 weight percent. More than this will adversely affect the strength and dielectric properties of the ceramic substrate. It has been found that the catalyst is effective in use. There, however, remains a problem in maintaining the correct ratio of hydrogen to steam during the binder burnoff phase of the firing cycle.

Brownlow et al. U.S. Pat. No. 4,474,731 proposes the use of nickel oxide as the catalyst to promote the removal of carbonaceous materials from a ceramic substrate.

Marshall U.S. Pat. No. 4,189,760 proposes a capacitor wherein layers of ceramic are coated with nickel oxide Thereafter, the nickel oxide is reduced to nickel which may then serve as the capacitor electrodes.

Dirstine U.S. Pat. No. 4,386,985 proposes additions of nickel oxide to a ceramic capacitor to increase the dielectric constant of the capacitor. It was also found that the nickel oxide prevents the nickel electrodes from dissolving in the ceramic during sintering.

Treptow U.S. Pat. No. 2,993,815 discloses the formation of a ceramic printed circuit board wherein a layer of copper is formed on a refractory substrate. Initially, copper or copper oxide is mixed with a glass-containing paste and then applied to the surface of a green refractory substrate. Thereafter, the coated substrate is fired in an oxidizing atmosphere to remove the carbonaceous residues and also to make sure that the copper that is present is in the form of copper oxide. During this step a refractory substrate-to-glass-to-copper bond is formed. Finally, the coated substrate is heated in a reducing atmosphere to reduce the copper oxide to copper.

Kato et al. discloses a ceramic composition containing a copper oxide. During a reducing heat treatment, the copper ions move to the surface of the ceramic. Thereafter, the ceramic coated with copper ions undergoes heating in an oxidizing atmosphere followed by heating in a reducing atmosphere. The end result is a ceramic substrate having a very thin coating of copper.

The disclosure of all of the above references is incorporated by reference herein.

Notwithstanding the above teachings of those skilled in the art, there remains a real need to improve the burnoff of carbonaceous residues.

This need arises from the fact that the process to remove the carbonaceous residues as taught in, for example, the Herron et al. references is extremely slow. It would be very desirable to be able to improve the process so as to make the removal of carbonaceous residues more effective and efficient.

It is, accordingly, an object of the invention to improve the burnoff of carbonaceous residues.

It is another object of the invention to reduce the time for effective burnoff of carbonaceous residues.

It is yet another object of the invention to maintain tighter control of the ambient during burnoff of the carbonaceous residues These and other objects of the invention will become more apparent after referring to the following description considered in conjunction with the accompanying drawings.

BRIEF SUMMARY OF THE INVENTION

One aspect of the invention relates to a method of enhancing the removal of carbon from multilayer ceramic substrate laminates during the sintering thereof, comprising the steps of:

providing a multilayer ceramic substrate laminate having metallic lines and vias and a reducible metal oxide in close proximity to the multilayer ceramic substrate laminate, the multilayer ceramic substrate laminate containing a polymeric binder which upon heating depolymerizes into carbon; and sintering the substrate laminate in an atmosphere which is reducing with respect to the reducible metal oxide and which is oxidizing with respect to the carbon.

Another aspect of the invention relates to a sintering arrangement for enhancing the removal of carbon from multilayer ceramic substrate laminate during the sintering thereof, comprising:

a ceramic substrate laminate having metallic lines and vias and containing a polymeric binder which upon heating depolymerizes into carbon; and a reducible metal oxide on at least one surface of the substrate laminate wherein the reducible metal oxide is chosen such that when the substrate laminate is sintered in an atmosphere which is oxidizing with respect to the carbon, the reducible metal oxide undergoes reduction to form an adherent layer of metallurgy on the surface of the multilayer ceramic substrate.

A further aspect of the invention relates to a sintering arrangement for enhancing the removal of carbon from multilayer ceramic substrate laminate during the sintering thereof, comprising:

a multilayer ceramic substrate laminate having metallic lines and vias and a polymeric binder which upon heating depolymerizes into carbon; and at least one setter tile proximate with the multilayer ceramic substrate laminate, the setter tile comprising a refractory oxide and a reducible metal oxide wherein the reducible metal oxide is chosen such that upon sintering the ceramic substrate laminate in an atmosphere which is oxidizing with respect to the carbon, the reducible metal oxide undergoes reduction to the non-oxide form.

A final aspect of the invention relates to a partially sintered setter tile composition comprising copper oxide and a refractory oxide with the copper oxide constituting at least 20 weight % of the composition.

DETAILED DESCRIPTION OF THE INVENTION

Figure 1:
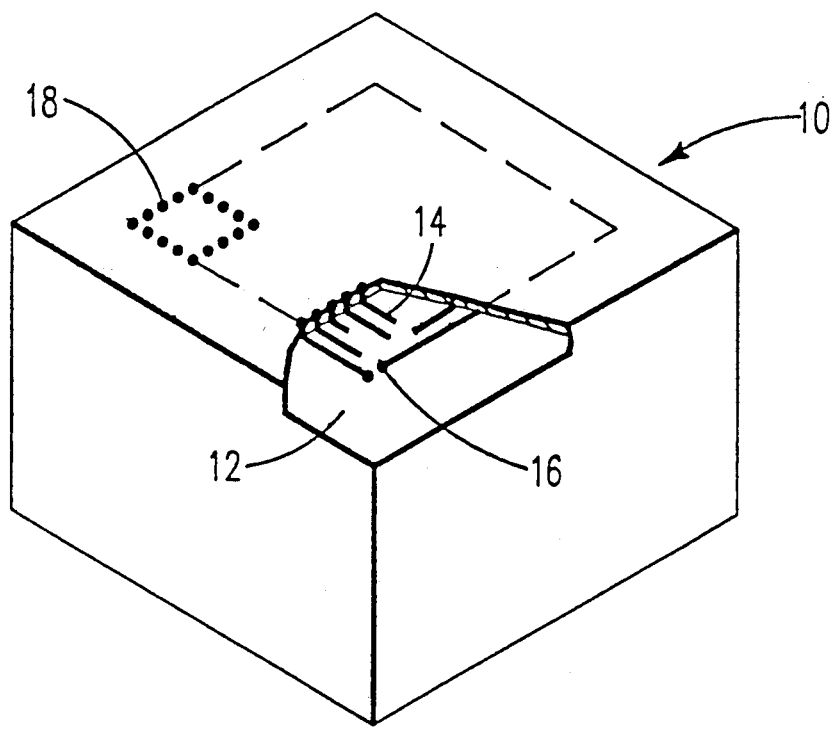
FIG. 1 is a perspective view of a known multi-layer ceramic substrate.

Referring to the Figures in more detail and particularly referring to FIG. 1, there is shown a sintered multi-layer ceramic substrate 10. The multi-layer ceramic substrate is comprised of a plurality of layers of ceramic material one of which 12 is shown. Each of the layers of the ceramic material has metallic lines 14 and vias 16. Additionally, the multi-layer ceramic substrate comprises top surface metallurgy 18 and bottom surface metallurgy (not shown).

Figure 2:
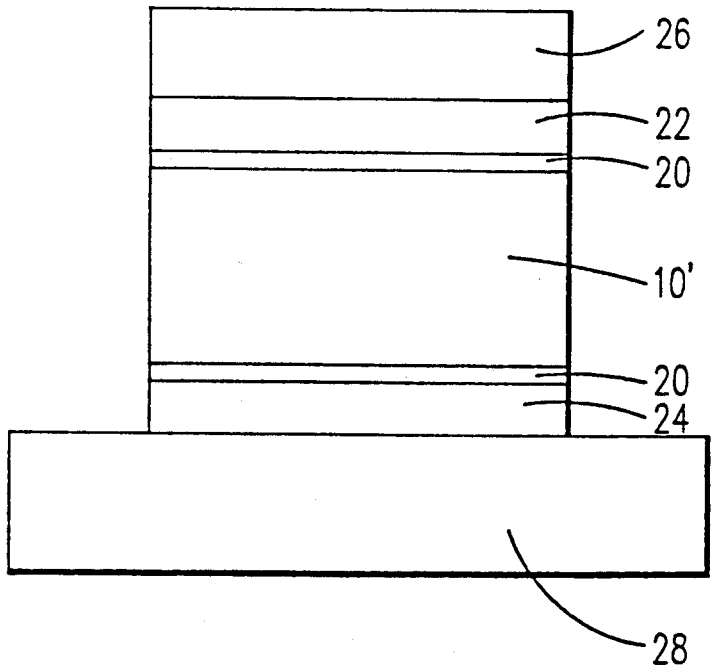
FIG. 2 is a side view of a multi-layer ceramic substrate laminate and sintering arrangement according to the invention.

Referring now to FIG. 2, the method according to the invention will be described. According to the invention there is disclosed a method of enhancing the removal of carbon from multi-layer ceramic substrate laminate during their sintering. The method comprises the steps of first providing an unfired multi-layer ceramic substrate laminate 10' having metallic lines 14 and vias 16. The method further comprises providing a reducible metal oxide in close proximity to the multi-layer ceramic substrate laminate 10'. The multi-layer ceramic substrate laminate contains a polymeric binder which upon heating depolymerizes into carbon as is well known in the art.

In the sintering of multi-layer ceramic substrate laminates the sintering arrangement will typically further comprise, as disclosed in U.S. patent application Ser. No. 859,093, the disclosure of which is incorporated by reference herein, a non-sintering ceramic sheet 22 on top of the ceramic substrate laminate and a non-sintering ceramic sheet 24 underneath the ceramic substrate laminate. Each of the non-sintering ceramic sheets may be, for example, an alumina green sheet. On top of this sintering arrangement will be a weight 26. The entire sintering arrangement sits on a setter tile 28. In place of weight there may be a second setter tile.

The next step in the method comprises sintering the substrate laminate 10' in an atmosphere which is reducing with respect to the reducible metal oxide and which is oxidizing with respect to the carbon. Such a sintering cycle is well known and is disclosed in the Herron et al., patents discussed previously. The steps of sintering converts the substrate laminate 10' into the substrate 10.

The preferred ceramic substrate laminate according to the invention has metallic lines and vias made from copper or copper alloys. It should be understood however, that the copper or the copper alloys may be replaced by other metals or alloys of good conductivity such as, nickel, molybdenum, silver, palladium or mixtures thereof. Further, it is preferred that where the metallic lines and vias are copper or copper alloys the reducible metal oxide is a copper oxide selected from the group consisting of $Cu_2O$ (cuprous oxide) and CuO (cupric oxide). If one of the other metals or alloys is used as the metallic lines and vias then the reducible metal oxide will be replaced so as to be the oxide of that other metal or alloy.

Figure 3:
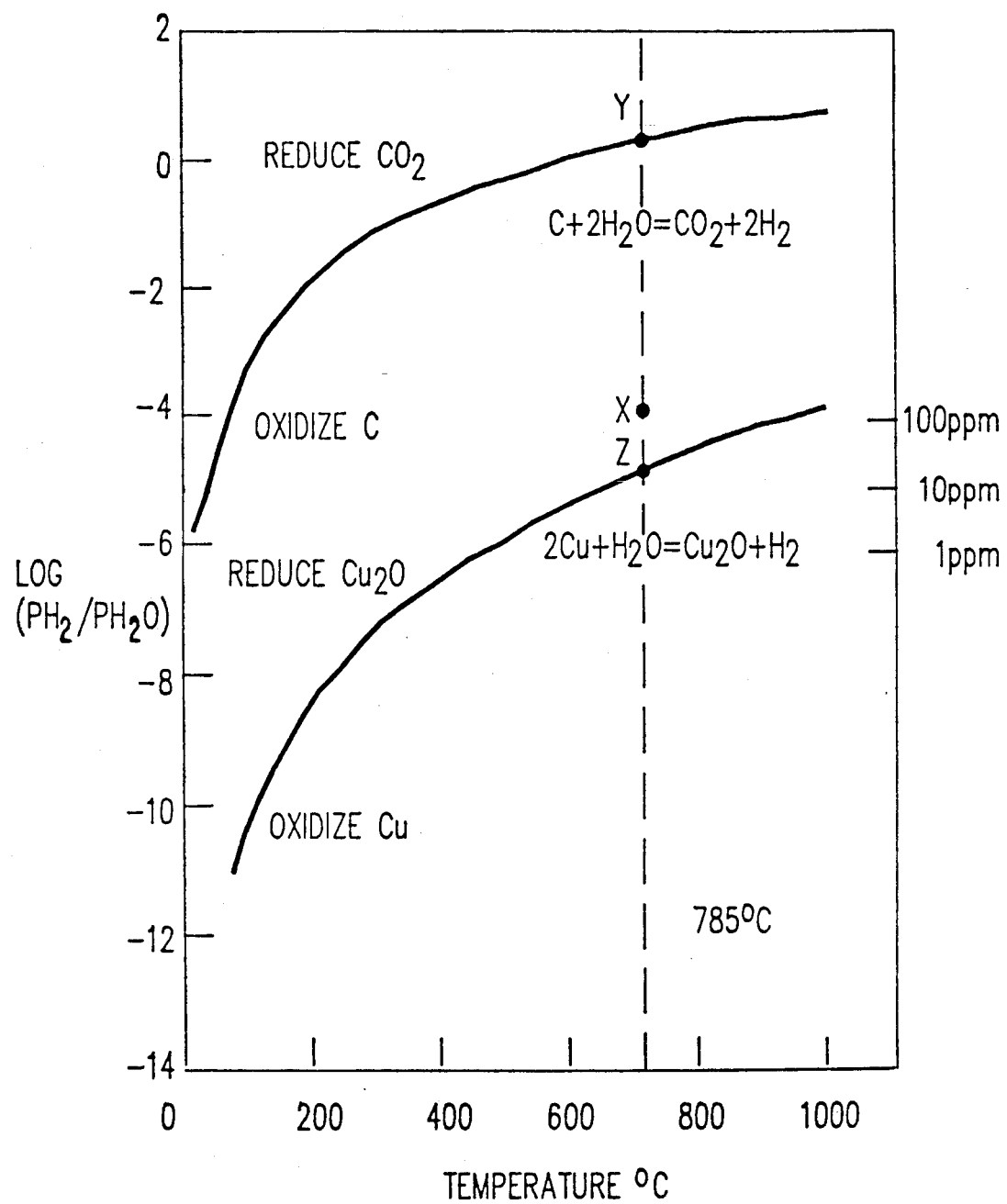
FIG. 3 is a graph illustrating the equilibrium between copper, carbon and their oxides in a $H_2/H_2O$ ambient.

The most important aspect of the present invention is the provision of the reducible metal oxide in close proximity to the multilayer ceramic substrate laminate. As taught in Herron et al. U.S. Pat. No. 4,234,367, binder burnoff occurs during the steam segment of the firing cycle. Generally, the temperature for binder burnoff will be between about 700° and 785° C. The desired atmosphere is such that the ratio of $H_2/steam = 10^{-4}$, (at 785° C.) which is an optimal atmosphere for not oxidizing copper (assuming copper lines and vias) while oxidizing carbon from the organic binders. This is marked as point X in FIG. 3. It should be noted that FIG. 3 is taken directly from the Herron et al. U.S. Pat. No. 4,234,367. Similar reasoning will apply to other metallurgies besides copper. For purposes of illustration, and not limitation, copper metallurgy is discussed. It should be understood, however, that other metals and alloys are included within the scope of the invention.

In practice, this ideal condition is not realized During the reaction $$C + 2H_2O(steam) = CO_2 + 2H_2$$

hydrogen is continuously liberated in situ which makes the actual condition for the ratio $H_2/H_2O >> 10^{-4}$. In the initial stages the $H_2/H_2O$ ratio in the vicinity of the substrates starts close to point Y because the supply of the $H_2O$ ambient is diffusion limited and the equilibrium $H_2/H_2O$ condition for the C and $H_2O$ reaction is maintained by the reaction. When most of the carbon is removed by the reaction, liberation of $H_2$ is decreased and diffusion no longer limits the $H_2/H_2O$ ratio; therefore, conditions begin to move towards point X.

Because the reaction rate decreases with increasing local $H_2$ concentration, the binder removal rate is not at the maximum as recommended by Herron et al., U. S. Pat. No. 4,234,367 and hence in practice, results in excessively long times required for binder removal. The present invention provides a method of practicing the steam segment at nearly ideal maximum rates for the carbon-steam reaction. The ideal maximum rate for a copper containing system occurs when the ratio of $H_2/H_2O$ is always at point Z as shown in FIG. 3. This is the equilibrium maintained by the following reaction, $$2Cu + H_2O = Cu_2O + H_2$$

This condition is always maintained in the vicinity of the substrate laminate by having both Cu and $Cu_2O$ proximate to the multilayer ceramic substrate laminate. If hydrogen or steam is in excess of the equilibrium ratio point Z, the reaction shifts to form either Cu or $Cu_2O$ to balance the shift. This means that the conditions become self-regulating as long as both Cu and $Cu_2O$ are present in some amount proximate to the substrate.

In the present invention, the above regulating condition is achieved by initially starting with CuO or $Cu_2O$ proximate to the substrate laminate As hydrogen is liberated from the carbon-steam reaction, the following reactions take place, $$2CuO + H_2 = Cu_2O + H_2O \text{ (initially)}$$

$$Cu_2O + H_2 = 2Cu + H_2O \text{ (final equilibrium)}$$

These reactions provide consumption of the excess hydrogen and the generation of more steam locally.

By knowing the amount of binder in the substrate laminate to be reacted, the amount of CuO or $Cu_2O$ to be initially placed proximate to the substrate laminate is determined such that there is an excess of $Cu_2O$ left, over and above the amount required to consume all of the hydrogen from the carbon reaction.

Both $Cu_2O$ or CuO can be present, but the amount required is greater for $Cu_2O$ than for CuO because of its lower oxygen content.

This kind of self-regulating buffered system maintains the ideal $H_2/H_2O$ ratio directly at the surface of the substrate laminate. The present invention should thus be considered as an improvement of, rather than a substitute for, the process of Herron et al. U.S. Pat. No. 4,627,160 wherein a copper oxide or other reducible metal oxide is incorporated in the ceramic substrate laminate itself. While the copper oxide catalyst within the ceramic substrate laminate aids in the removal of carbon from the ceramic substrate laminate, the additional reducible metal oxide of the present invention in proximity to the multilayer ceramic substrate laminate serves to enhance that removal of carbon, as will be shown in more detail hereafter.

Typically, the polymeric binder will comprise polyvinyl butyral (PVB) resin. However, it is within the scope of the invention for the polymeric binder to comprise polymethyl methacrylate (PMMA), polyalphamethyl styrene, or other well known ceramic binder systems.

It is most preferred that the ceramic substrate laminate comprises a ceramic selected from the group consisting of cordierite type glass ceramics and spodumene type glass ceramics such as that disclosed in Kumar et al. U.S. Pat. Nos. 4,413,061 and 4,301,324, the disclosures of which are incorporated by reference herein.

The preferred sintering atmosphere is an atmosphere of steam and hydrogen wherein the hydrogen/steam ratio is in the range of $10^{-4}$ to $10^{-6.5}$. The sintering temperature must be less than the melting point of the metallic lines and vias.

While the reducible metal oxide must be in close proximity to the multi-layer ceramic substrate laminate 10' it may be situated in a number of different locations just so long as it is proximate to the substrate laminate. Thus, the reducible metal, oxide may be on at least one surface of the ceramic substrate laminate. For example, as shown in FIG. 2, the reducible metal oxide 20 is directly on the top (or horizontal) surface of the ceramic substrate laminate 10'. Additionally, the reducible metal oxide 20 may also be located directly on the bottom surface of the ceramic substrate laminate as well. When the reducible metal oxide is directly on a surface of the multilayer ceramic substrate laminate the reducible oxide, upon reducing to the metal, forms an adherent layer of metal on the ceramic substrate laminate and then the substrate. In practice, what happens is that the reducible metal oxide first at least partially dissolves into the ceramic substrate laminate and subsequently forms an adherent layer of metal on its surface. An advantage of forming this layer of metal directly on the ceramic substrate is that instead of the top or bottom surface metallurgy being screened on and then fired, the metallurgy may be simply formed directly on the substrate in situ and then patterned by photolithographic steps.

Alternatively, the reducible metal oxide may be located in at least one setter tile proximate to the ceramic substrate laminate. This latter embodiment will be discussed in more detail shortly The sintering arrangement as shown in FIG. 2 thus represents one aspect of the invention.

There may further be a sintering arrangement according to the invention for enhancing the removal of carbon from multi-layer ceramic substrate laminates during their sintering wherein at least one setter tile, such as setter tile 28 in FIG. 2, is proximate with the multi-layer ceramic substrate laminate. The setter tile 28 comprises a refractory oxide and a reducible metal oxide. The reducible metal oxide is chosen such that upon sintering the ceramic substrate laminate in an atmosphere which is oxidizing with respect to the carbon, the reducible metal oxide undergoes reduction to the non-oxide (or metallic) form. In one embodiment the setter tile may be in direct contact with the ceramic substrate laminate.

The refractory oxide in the setter tile may be any refractory oxide although it is preferred that it be alumina ($Al_2O_3$), silica ($SiO_2$), magnesia (MgO), zirconia ($ZrO_2$) or combinations thereof.

It is most preferred that the setter tile is partially sintered, thereby ensuring a porous body. The porosity is desirable since it allows the ambient gases to flow through the setter tile and contact the ceramic substrate laminate, thereby rendering more efficient the removal of the binder decomposition products. It should be understood that partially sintered means having at least 40% porosity and optimally, 45-50% porosity. For a 92 weight % $Al_2O_3$, 8 weight % glass setter tile, for example, a partially sintered body may be obtained by sintering between 1000-1350° C. for about 12 to 24 hours after a preliminary heating cycle at lower temperatures for removal of the binder.

Figure 4:
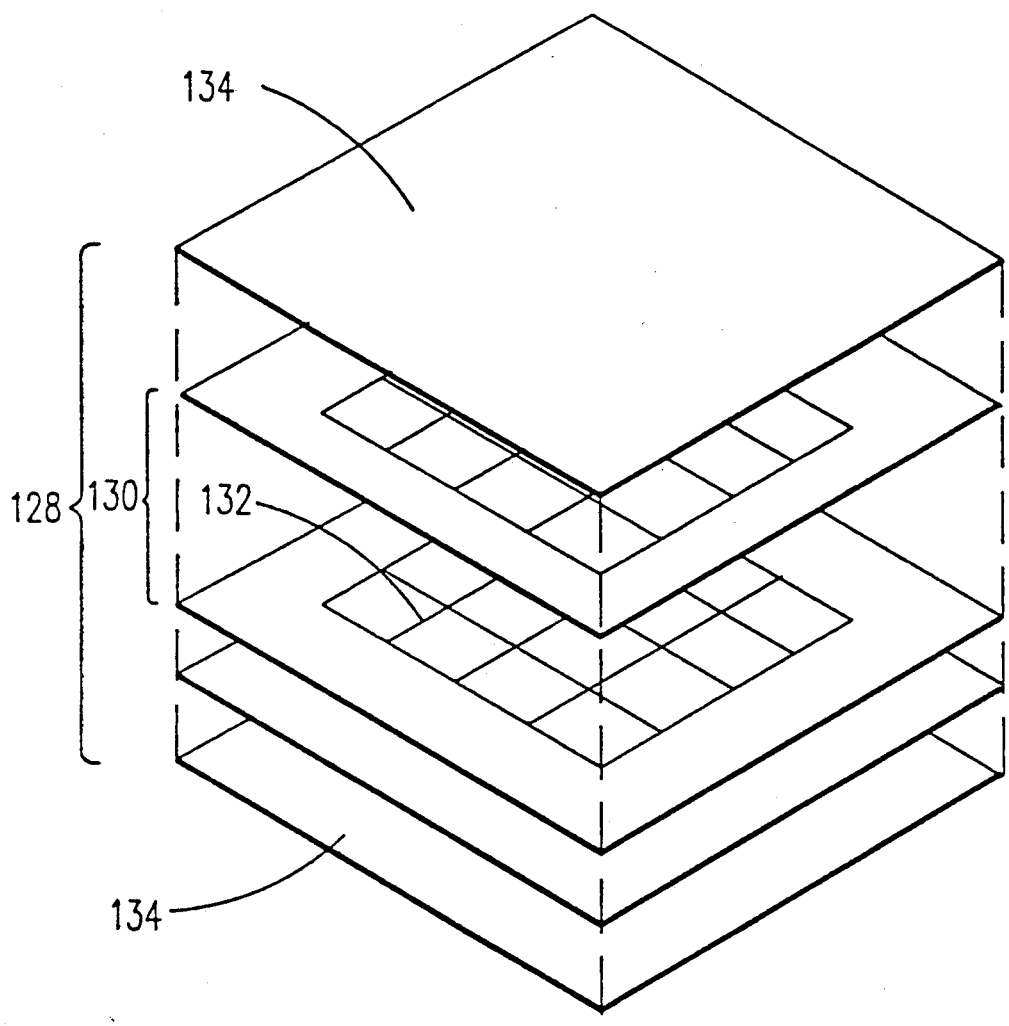
FIG. 4 is an exploded perspective view of a setter tile according to the invention.

Referring now to FIG. 4 there is shown an exploded perspective view of a setter tile 128 according to the invention. Setter tile 128 comprises a plurality of layers 130 of refractory oxide having the reducible metal oxide screened thereon. Thus each layer 130 has a pattern 132 of reducible metal oxide screened thereon. On either side of the plurality of screened layers 130 is at least one layer 134 which simply comprises refractory oxide without any reducible metal oxide thereon. Since either side of the setter tile 128 has a plain ceramic surface, the setter tile 128 may be placed in direct contact with the ceramic substrate without the necessity of the plain non-sintering ceramic sheets 24 and 22 as discussed previously.

Figure 5:
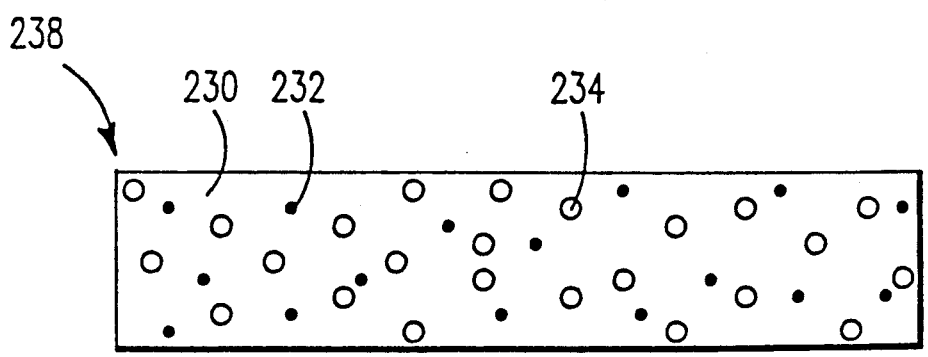
FIG. 5 is a cross-sectional view of another embodiment of a setter tile according to the invention.

Referring now to FIG. 5 there is shown another embodiment of a setter tile according to the invention. In this case setter tile 228 comprises refractory oxide 230 having the reducible metal oxide 232 dispersed therein. This particular setter tile 228 has porosity 234 which aids in the flow of gases from the ambient to the surface of the multi-layer ceramic substrate laminate.

As noted previously, the amount of reducible metal oxide present should be in excess of that required for complete buffering of the ambient. This in turn will vary depending on the amount of binder present. In general, the amount of reducible metal oxide present in the fired setter tile should be between about 20 and 70 weight percent, with the remainder being the refractory oxide.

In either of the embodiments of FIGS. 4 or 5 the reducible metal oxide is preferably a copper oxide selected from the group consisting of cuprous oxide ($Cu_2O$) and cupric oxide (CuO). Of course, as described previously the reducible metal oxide may be changed if the metal lines and vias of the multi-layer ceramic substrate laminate are other than copper or copper alloys.

During the sintering cycle most of the initial copper oxide in the buffered setter tile has been converted to copper metal by the hydrogen from the carbon reaction. To regenerate these tiles they are heated in air to between 500° and 800° C. to convert all of the metal into CuO (only CuO is stable in air at these temperatures, not $Cu_2O$). The setter tile is now ready to be reused in the next sintering cycle.

A final aspect of the invention relates to a partially sintered setter tile composition comprising copper oxide and refractory oxide with the copper oxide constituting at least 20 weight % of the composition. The copper oxide may be selected from the group consisting of cupric oxide and cuprous oxide. The refractory oxide may be any of those discussed previously.

The advantages and objects of the invention will become more apparent after referring to the following examples.

EXAMPLE 1

Glass powder of approximate composition by weight of 20% magnesium oxide, 25% aluminum oxide with the remainder being silicon dioxide and very small amounts of nucleating agents such as phosphorus pentoxide and boron trioxide, was mixed, in a ball mill, with a suitable organic binder such as polyvinyl butyral and solvents such as methyl-isobutyl-ketone in appropriate proportions to yield a castable slurry. No copper oxide catalyst was added to the composition. The slurry was then cast into green sheets of approximately 400-599 microns in thickness by a doctor blading technique. After drying the green sheets to expel the solvents, they were cut to suitable dimensions and laminated in a press under heat and pressure to form a monolithic laminate A paste prepared by mixing cuprous oxide ($Cu_2O$) and a suitable paste vehicle such as Texanol (consisting of 70% by weight of cuprous oxide) was then screened over the top and bottom surfaces of the substrate laminate to form a layer of approximate thickness of 50 microns. The prepared laminate was placed on a refractory setter tile. A similar setter tile was also placed on top of the laminate to exert downward pressure on the laminate during sintering and constrain its sintering in the plane of the laminate. The assembly was then sintered in a programmable furnace as follows. The initial heating of the laminate was carried out in an inert ambient of nitrogen to decompose and carbonize the binder. On reaching a temperature of about 700° C., the sintering atmosphere was changed to one consisting of water vapor and hydrogen in the proportion of $10^4:1$ at which carbon oxidizes while copper does not. After holding for several hours at this temperature, the laminate was heated in nitrogen for several hours to expel water dissolved in the glass powder, before being heated to the final sintering temperature of about 950° C. in a reducing ambient of hydrogen. The laminate was cooled to room temperature in nitrogen ambient.

The sintered, glass ceramic substrate thus prepared was found to have an integral surface layer of pure copper metal of thickness of about 20 microns. It was also found that the presence of the copper oxide layer on the substrate surface had aided in the complete removal of carbon residues uniformly through its thickness.

By combining suitable photolithographic and etching techniques, circular pads were formed out of the integral copper layer on the sintered substrate. The adhesion of the copper layer to the glass ceramic surface was then tested by soldering studs to the circular copper pads and pull testing. The adhesion of the copper layer was found to be adequate and comparable to conventionally formed thick or thin film metal patterns on the glass ceramic surface.

EXAMPLE 2

Setter tiles were prepared in the following manner. A slurry of alumina, glass, binders, solvents and other organic additives was cast into green sheets. (The final composition after firing was 92 weight % alumina, 8 weight % glass). Thereafter, a paste consisting of CuO and a suitable paste vehicle such as PVB or ethyl cellulose was prepared. The CuO comprised 82 weight % of the paste. The paste was then patterned in a square hatch pattern, such as that shown in FIG. 4, on the green sheets. There was about 5 to 8 grams of paste per green sheet.

A plurality of the screened green sheets were stacked together. On the top and bottom of the stack were 2 or 3 unscreened green sheets. The stack was then laminated at 75° C. and 6000 psi pressure followed by presintering at about 980° C. to remove the organics. The final laminate had 45 to 50% open porosity.

A conventional glass-ceramic substrate laminate such as that described in the Kumar et al. patents was prepared, except that the substrate contained about 0.15% copper oxide as taught in the Herron et al. U.S. Pat. No. 4,627,160. One setter tile was placed on the top and underneath the bottom of the glass ceramic substrate laminate. The arrangement so formed then underwent a conventional sintering cycle. The temperature of the steam segment was 730° C. and the $H_2/H_2O$ ratio was $10^{-4}$.

After 18 hours there was complete binder burnoff. Under the same sintering conditions, but without the copper oxide-containing setter tile, binder burnoff would have occurred in about 30 hours.

EXAMPLE 3

Setter tiles were prepared by making a slurry of a composition consisting in weight percent of

| | |
|---|---|
| CuO | 49.99 |
| $Al_2O_3$ | 25.26 |
| Butvar B-90 | 2.58 |
| Benzoflex | 0.90 |
| Methanol | 5.37 |
| Methylisobutylketone | 16.12 | which was then cast into green sheets. Twenty green sheets were laminated together under heat and pressure to form the tile which was then heated to about 965° C. to remove the binders and to partially sinter it. The partially-sintered setter tiles contained about 40% connected porosity. The final composition of the setter tile was 66.33 weight % CuO, 33.67 weight % $Al_2O_3$.

Several conventional glass ceramic substrate laminates such as that described in the Kumar et al. patents were prepared, except that the substrates contained about 0.15 weight % copper oxide as taught in the Herron et al. U.S Pat. No. 4,627,160. In one set of experiments, one copper-oxide containing setter tile was placed on the top and underneath the bottom of some of the glass ceramic substrate laminates. The setter tiles and substrate laminates were then sintered in a conventional sintering cycle. The temperature of the steam segment was either 730° C. or 750° C. and the $H_2/H_2O$ ratio was $10^{-4}$.

In a second set of experiments, glass ceramic substrate laminates were sintered with setter tiles which did not contain copper oxide. All other experimental variables were held constant.

The time required for binder burnoff (<300 ppm carbon in the glass ceramic) was measured for each of the sintered glass ceramic substrates. The results are summarized in Table 1.

TABLE 1

| | Time Required for Binder Burnoff | |
|---|---|---|
| Temperature of Steam Segment | Setter Tile with CuO | Setter Tile without CuO |
| 730° C. | 12 | 22 |
| 750° C. | 9 | 14 |

An examination of Table 1 thus convincingly shows the reduction in time for binder burnoff was 45% (at 730° C.) and 36% (at 750° C.) when a copper oxide was incorporated in the setter tile.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A sintering arrangement for enhancing the removal of carbon from multilayer ceramic substrate laminates during the sintering thereof comprising:
   an unfired ceramic substrate laminate having nonoxide metallic lines and vias and containing a polymeric binder which upon heating depolymerizes into carbon; and
   a reducible metal oxide prior to sintering on at least one surface of the substrate laminate wherein the reducible metal oxide is chosen such that when the substrate laminate is sintered in an atmosphere which is oxidizing with respect to the carbon, the reducible metal oxide undergoes reduction to form an adherent layer of metallurgy on the surface of the multilayer ceramic substrate.

2. The sintering arrangement of claim 1 wherein the metallic liens and vias are copper or copper alloys.

3. The sintering arrangement of claim 1 wherein the reducible metal oxide is a copper oxide selected from the group consisting of CuO and $Cu_2O$.

4. The sintering arrangement of claim 1 wherein the polymeric binder comprises polyvinyl butyral resin.

5. The sintering arrangement of claim 1 wherein the ceramic substrate laminate comprises a ceramic selected from the group consisting of cordierite glass ceramics and spodumene glass ceramics.

6. A sintering arrangement for enhancing the removal of carbon from multilayer ceramic substrate laminates during the sintering thereof, comprising:
   an unfired multilayer ceramic substrate laminate having nonoxide metallic lines and vias and a polymeric binder which upon heating depolymerizes into carbon; and
   at least one setter tile proximate with the multilayer ceramic substrate laminate, the setter tile comprising refractory oxide and a reducible metal oxide prior to sintering wherein the reducible metal oxide is chosen such that upon sintering the ceramic substrate laminate in an atmosphere which is oxidizing with respect to the carbon, the reducible metal oxide undergoes reduction to the non-oxide form.

7. The sintering arrangement of claim 6 wherein the setter tile is in direct contact with the ceramic substrate laminate.

8. The sintering arrangement of claim 6 wherein the setter tile comprises a plurality of layers of refractory oxide having the reducible metal oxide screened thereon.

9. The sintering arrangement of claim 6 wherein the setter tile comprises refractory oxide having the reducible metal oxide dispersed therein.

10. The sintering arrangement of claim 6 wherein the setter tile is partially sintered.

11. The sintering arrangement of claim 6 wherein the refractory oxide is selected from the group consisting of alumina, silica, magnesia, zirconia and mixtures thereof.

12. The sintering arrangement of claim 1 wherein the metallic liens and vias are copper or copper alloys.

13. The sintering arrangement of claim 6 wherein the reducible metal oxide is a copper oxide selected from the group consisting of CuO and $Cu_2O$.

14. The sintering arrangement of claim 6 wherein the polymeric binder comprising polyvinyl butyral resin.

15. The sintering arrangement of claim 6 wherein the ceramic substrate laminate comprises a ceramic selected from the group consisting of cordierite glass ceramics and spodumene glass ceramics.

* * * * *